United States Patent
Hazeyama et al.

[19]

[11] Patent Number: 5,902,758
[45] Date of Patent: May 11, 1999

[54] LOW TEMPERATURE FIRING GLASS-CERAMIC SUBSTRATE AND PRODUCTION PROCESS THEREOF

[75] Inventors: Ichiro Hazeyama; Kazuhiro Ikuina, both of Tokyo, Japan

[73] Assignee: Nec Corporation, Tokyo, Japan

[21] Appl. No.: 09/038,622

[22] Filed: Mar. 12, 1998

[30] Foreign Application Priority Data

Mar. 12, 1997 [JP] Japan ................................. 9-057729

[51] Int. Cl.⁶ ........................... C03C 10/04; C03C 14/00
[52] U.S. Cl. ................................. 501/5; 501/32; 501/65; 65/33.7
[58] Field of Search ...................... 501/5, 32, 65, 501/66; 65/33.7

[56] References Cited

U.S. PATENT DOCUMENTS

| | | | |
|---|---|---|---|
| 4,939,021 | 7/1990 | Aoki et al. | 501/5 |
| 5,258,335 | 11/1993 | Muralidhar et al. | 501/5 |
| 5,468,694 | 11/1995 | Taguchi et al. | 501/5 |

FOREIGN PATENT DOCUMENTS

| | | |
|---|---|---|
| 5-85815 | 4/1993 | Japan . |
| 408059333 | 3/1996 | Japan . |

*Primary Examiner*—Karl Group
*Attorney, Agent, or Firm*—Sughrue, Mion, Zinn Macpeak & Seas, PLLC

[57] ABSTRACT

A low temperature firing glass-ceramic substrate comprising a borosilicate glass, α-alumina, γ-alumina, and mullite crystals crystallized out in a dispersed form from the borosilicate glass and the γ-alumina, and a production process of the substrate. It is an object of this invention to provide a glass-ceramic substrate, which is low in dielectric constant and dielectric loss and high in strength and is useful for multilayer wiring.

7 Claims, 1 Drawing Sheet

LOW TEMPERATURE FIRING GLASS-CERAMIC SUBSTRATE AND PRODUCTION PROCESS THEREOF

BACKGROUND OF THE INVENTION

1. Field of the Invention

This invention relates to a low temperature firing glass-ceramic substrate permitting co-firing with a low-resistance conductor such as Au, Ag or Cu, especially a glass-ceramic substrate having a low dielectric constant, a small dielectric loss and high strength and also to a production process thereof.

2. Description of the Related Art

Ceramic substrates have been used as high-density wiring substrates because they easily allow high-degree multilayer wiring by the green sheet lamination process. Although aluimna is most common as a ceramic material for them, it is accompanied by problems that (1) for its firing temperature as high as about 1,600° C., high-resistance W or Mo has to be chosen as a wiring material for internal layers to be formed by co-firing and (2) for its relative dielectric constant as high as about 10, a reduction in dielectric constant has to be achieved desirably from the viewpoint of achieving high-speed transmission.

On the other hand, glass-ceramic materials, which are composite materials of glass of relatively low softening point and ceramics, have been developed as multilayer wiring substrate materials capable of overcoming the above-mentioned problems, because (1) they can be fired at 900 to 1,000° C. and can hence choose a low-resistance conductor such as Au, Ag or Cu as a conductor metal for internal layers and (2) they can attain a lower dielectric constant by using glass of low dielectric constant.

Nonetheless, low-dielectric-constant materials have a problem in reliability as the dielectric constant and strength of a material are generally in a substantially proportional relationship. In addition to this trade-off relationship between dielectric constant and material strength, there is an increasing demand for a reduction in the dielectric loss of a substrate material to meet the requirement for lower transmission losses in high frequency circuits employed in a communication network.

SUMMARY OF THE INVENTION

With the above-mentioned various problems in view, the present invention has as objects thereof the provision of a glass-ceramic substrate low in dielectric constant and dielectric loss and high in strength and also the provision of its production process.

The present invention relates to a low temperature firing glass-ceramic substrate comprising a borosilicate glass, α-alumina, γ-alumina, and mullite crystals crystallized out in a dispersed form from the borosilicate glass and the γ-alumina.

In addition, the present invention also relates to a process for producing a low temperature firing glass-ceramic substrate by firing at 850 to 1,100° C. a mixture comprising 50 to 80 wt. % of a borosilicate glass and 10 to 50 wt. % of γ-alumina having a particle size not greater than 50 nm, which compises causing a mullite crystal phase to crystalize out in a dispersed form from the borosilicate glass and the γ-alumina.

According to the present invention, a glass-ceramic low in dielectric constant and dielectric loss and high in strength is obtained. Use of this material makes it possible to provide a low temperature firing glass-ceramic substrate having excellent dielectric characteristics and high strength.

DETAILED DESCRIPTION OF THE PREFERRED EMBODIMENTS

Figure 1:
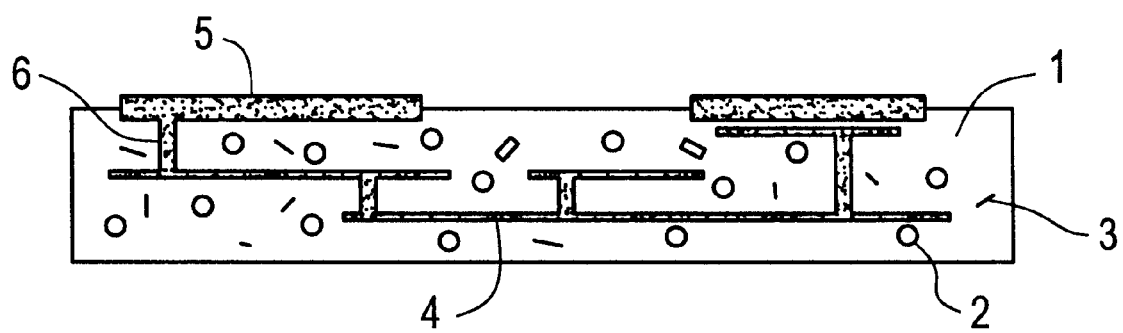
FIG. 1 is a simplified cross-sectional view of a low temperature firing glass ceramic substrate according to one embodiment of the present invention.

Based on embodiments, the present invention will hereinafter be described in detail.

The low temperature firing glass-ceramic substrate according to the present invention has a structure that α-alumina crystal grains and mullite crystal grains have been crystallized out in a dispersed form in a borosilicate glass matrix. Selection of a composition having a significantly low softening point as the borosilicate glass permits low temperature firing, so that a low-resistance conductor such as Au, Ag or Cu can be chosen as a wiring material for internal layers. Further, owing to the possession of the structure that α-alumina grains and mullite grains have crystallized out in a dispersed form, the low temperature firing glass-ceramic substrate according to the present invention has another characteristic feature that high strengthening can be attained. In particular, the reliability has been improved owing to the formation of mullite crystals which are needle-like crystals and are relatively low in dielectric constant.

The production process of this invention for a low temperature firing glass-ceramic substrate includes the step that a mixture containing a borosilicate glass and γ-alumina particles and, if necessary, α-alumina particles is fired to cause a mullite crystal phase to crystallize out in a dispersed form from the borosilicate glass and γ-alumina particles.

Preferably, the production process of this invention for the low temperature firing glass-ceramic substrate is characterized in that a mixture, which contains 50 to 80 wt. % of a borosilicate glass, 0 to 30 wt. % (preferably 10 to 30 wt. %) of α-alumina of 0.5 to 5 μm in particle size and 10 to 50 wt. % of γ-alumina, is fired at 850 to 1,100° C. to cause a mullite crystal phase to crystallize out in a dispersed form from the borosilicate glass and the γ-alumina in the glass matrix.

The proportion of the borosilicate glass in the above-described mixture affects the firing temperature and the strength of the resulting substrate. The setting of the proportion of the borosilicate glass at 50 wt. % or higher has made it possible to satisfactorily employ a firing temperature as low as 1,100° C. or lower and also to facilitate co-firing with a conductor such as Cu. On the other hand, the setting of the proportion of the borosilicate glass at 80 wt. % or lower has made it possible to bring about sufficient strength. From the foregoing, it is preferable to set the proportion of the borosilicate glass at 50 to 80 wt. %. Further, a proportion of from 60 to 75 wt. % is desired because it allows to use a firing temperature as low as 900 to 1,000° C. and also to bring about flexural strength as high as 200 MPa or higher.

In the substrate production process of this invention, the above-described borosilicate glass may preferably contains 75 to 85 wt. % of $SiO_2$ and 15 to 25 wt. % of $B_2O_3$, at least. More preferably, the borosilicate glass may also contain, in addition to the above-described oxides, at least one oxide selected from up to 2.5 wt. % of $K_2O$, up to 2.5 wt. % of $Na_2O$, up to 2 wt. % of $Al_2O_3$, up to 1 wt. % of MgO, up to 1 wt. % of CaO or up to 1 wt. % of $TiO_2$. Especially preferably, the borosilicate glass may also contain, in addition to the above-described oxides, at least one oxide selected from 1.0 to 2.5 wt. % of $K_2O$, 0.01 to 2.5 wt. % of $Na_2O$, 0.01 to 2 wt. % of $Al_2O_3$, 0.01 to 1 wt. % of MgO, 0.01 to 1 wt. % of CaO or 0.01 to 1 wt. % of $TiO_2$.

In the substrate production process according to the present invention, addition of α-alumina particles of 0.5 to 5 μm in particle size is desired as they can improve the strength. A particle size of 5 μm or smaller is desired, since dispersion of α-alumina particles having a particle size greater than 5 μm leads to reduced sinterability. On the other hand, addition of α-alumina having a particle size smaller than 0.5 μm leads to lowered dispersibility, so that α-alumina of 0.5 μm or greater is desired. Further, addition of α-alumina of 1 to 2 μm or so is desired from the standpoint of improvements in dispersibility and strength.

In the substrate production process of this invention, addition of γ-alumina having a particle size of from 5 to 50 nm has an effect that, in the course of the firing at 850 to 1,100° C., it reacts with the borosilicate glass to cause a mullite crystal phase to crystallize out. Production of γ-alumina particles having a particle size smaller than 5 nm is difficult at present. Further, γ-alumina of 50 nm or smaller in particle size makes it easier to cause a mullite phase to crystallize out during the firing at 1,100° C. or lower. It is therefore desired to add γ-alumina of 5 to 50 nm in particle size.

Concerning the proportion of γ-alumina to be added, a proportion of 10 wt. % or higher leads to a further improvement in strength, and a proportion of 50 wt. % or lower leads to a further improvement in sinterability so that sintering at 1,100° C. or lower is facilitated still further. Accordingly, a proportion of from 10 to 50 wt. % is desired.

Without addition of α-alumina, it is possible to improve the strength by α-alumina and mullite which are caused to crystallize out from the borosilicate glass and γ-alumina in the course of firing. Addition of α-alumina is however desired, because its addition makes it possible to improve the strength further and, when fired at a temperature of 1,000° C. or higher, is also effective in preventing a cristobalite phase from crystallizing out from the borosilicate glass. Addition of α-alumina in any proportion greater than 30 wt. % is however not preferred, because such a high proportion of α-alumina lowers the proportion of γ-alumina, which permits sintering at 1,100° C. or lower, to less than 10 wt. %, thereby resulting in a loss of the strength-enhancing effect of γ-alumina.

A description will next be made of the overall construction of the substrate according to the one embodiment of the present invention. As is illustrated in FIG. 1, the substrate is a glass-ceramic substrate having a structure that α-alumina crystals 2 and mullite crystals 3 are dispersed in a borosilicate glass 1 as a matrix. Internal-layer conductors 4 and via conductors 6 are desirably made of Au, Ag or Cu. Designated at numeral 5 in the drawing are surface-layer conductors.

In a substrate production process according to one embodiment of the present invention, a glass-ceramic substrate having the structure that α-alumina crystals and mullite crystals have crystallized out in a matrix of a borosilicate glass is produced by fining a mixture composed of the borosilicate glass, α-alumina and γ-alumina.

Owing to the crystallized mullite crystals, the thus-obtained glass-ceramic substrate is low in dielectric constant and dielectric loss and high in strength.

The present invention will hereinafter be described further by examples. It should however be borne in mind that the present invention is not limited to the following examples.

EXAMPLES 1 & 2

In each example, borosilicate glass powder the composition of which was 82.0 wt. % $SiO_2$, 16.0 wt. % $B_2O_3$, 0.2 wt. % $Al_2O_3$, 0.2 wt. % MgO, 0.2 wt. % CaO, 0.2 wt. % $TiO_2$, 0.2 wt. % $Na_2O$ and 2.0 wt. % $K_2O$ in terms of oxides, α-alumina powder of 1 μm in average particle size and γ-alumina powder of 10 nm in average particle size were weighed in proportions of 75, 0 and 25 wt. % (Example 1) or 60, 10 and 30 wt. % (Example 2), respectively. After the thus-weighed materials were mixed, green sheets were prepared by a usual method. Some of the thus-prepared green sheets were laminated and then compression-bonded under heat, followed by firing under the corresponding conditions shown in Table 1.

The dielectric constants of the resultant sintered bodies were 5.0 (Example 1) and 5.5 (Example 2), respectively. Nonetheless, measuremments of their flexural strength indicated strength sufficient to assure high reliability as shown in Table 1. Further, pellets were cut out from those sintered bodies, and their dielectric losses were measured by the cavity resonator method. They were found to have small dielectric losses as shown in Table 1.

Those sintered bodies were also subjected to an identification of phases by X-ray diffraction. α-Alumina, mullite and some γ-alumina were identified from the sintered body of Example 1, whereas α-alumina and mullite were identified form the sintered body of Example 2.

In each of the examples, via holes were formed through the remaining green sheets. Those green sheets were each subjected to via filling with an Ag paste and also to pattern printing. Several green sheets so obtained were laminated and compression-bonded under heat into a laminate. The laminate was fired under firing conditions similar to the corresponding ones shown in Table 1. The green sheets of the respective examples were confirmed to be able to provide low temperature firing glass-ceramic substrates.

TABLE 1

|  |  | Example 1 | Example 2 |
|---|---|---|---|
| Composition | Borosilicate glass | 75 wt. % | 60 wt. % |
|  | α-Alumina | 0 wt. % | 10 wt. % |
|  | γ-Alumina | 25 wt. % | 30 wt. % |
| Firing conditions |  | 900° C. | 950° C. |
|  |  | Held for 1 hr in air | Held for 1 hr in air |
| Dielectric constant (1 MHz) |  | 5.0 | 5.5 |
| Dielectric loss tangent (10 GHz) |  | 0.002 | 0.002 |
| Flexural strength |  | 180 MPa | 210 MPa |

What is claimed is:

1. A low temperature firing glass-ceramic substrate comprising a borosilicate glass, α-alumina, γ-alumina, and mullite crystals crystallized out in a dispersed form from said borosilicate glass and said γ-alumina.

2. The substrate according to claim 1, wherein said borosilicate glass comprises 75 to 85 wt. % of $SiO_2$ and 15 to 25 wt. % of $B_2O_3$.

3. The substrate according to claim 2, wherein said borosilicate glass additionally comprises at least one oxide selected from up to 2.5 wt. % of $K_2O$, up to 2.5 wt. % of $Na_2O$, up to 2 wt. % of $Al_2O_3$, up to 1 wt. % of MgO, up to 1 wt. % of CaO or up to 1 wt. % of $TiO_2$.

4. A process for producing a low temperature firing glass-ceramic substrate by firing at 850 to 1,100° C. a mixture comprising 50 to 80 wt. % of a borosilicate glass and 10 to 50 wt. % of γ-alumina having a particle size not greater than 50 nm, which compises causing a mullite crystal phase to crystalize out in a dispersed form from said borosilicate glass and said γ-alumina.

5. The process according to claim 4, wherein said mixture additionally comprises up to 30 wt. % of α-alumina of 0.5 to 5 μm in particle size.

6. The process according to claim 4, wherein said borosilicate glass comprises 75 to 85 wt. % of $SiO_2$ and 15 to 25 wt. % of $B_2O_3$.

7. The process according to claim 6, wherein said borosilicate glass additionally comprises at least one oxide selected from up to 2.5 wt. % of $K_2O$, up to 2.5 wt. % of $Na_2O$, up to 2 wt. % of $Al_2O_3$, up to 1 wt. % of MgO, up to 1 wt. % of CaO or up to 1 wt. % of $TiO_2$.

\* \* \* \* \*